US010024718B2

(12) United States Patent
Campbell

(10) Patent No.: US 10,024,718 B2
(45) Date of Patent: Jul. 17, 2018

(54) METHODS, SYSTEMS, AND COMPUTER READABLE MEDIA FOR TRACKING HUMAN INTERACTIONS WITH OBJECTS USING MODULAR SENSOR SEGMENTS

(71) Applicant: Triangle Strategy Group, LLC, Raleigh, NC (US)

(72) Inventor: Patrick Joseph Campbell, Raleigh, NC (US)

(73) Assignee: Triangle Strategy Group LLC, Raleigh, NC (US)

( * ) Notice: Subject to any disclaimer, the term of this patent is extended or adjusted under 35 U.S.C. 154(b) by 0 days.

(21) Appl. No.: 14/586,389

(22) Filed: Dec. 30, 2014

(65) Prior Publication Data
US 2015/0184997 A1 Jul. 2, 2015

Related U.S. Application Data

(60) Provisional application No. 61/923,113, filed on Jan. 2, 2014.

(51) Int. Cl.
*G01J 5/02* (2006.01)
*G01J 3/50* (2006.01)
(Continued)

(52) U.S. Cl.
CPC ............. *G01J 3/50* (2013.01); *G01S 7/4813* (2013.01); *G01S 17/46* (2013.01); *G01S 17/87* (2013.01);
(Continued)

(58) Field of Classification Search
CPC ........ G01J 5/20; G01J 5/08; G01J 5/16; G01J 5/12; H04N 5/33
See application file for complete search history.

(56) References Cited

U.S. PATENT DOCUMENTS 4,212,361 A 7/1980 Stocker
4,660,160 A 4/1987 Tajima et al.
(Continued)

FOREIGN PATENT DOCUMENTS

JP 05-135084 A 6/1993
JP 05-278817 A 10/1993
(Continued)

OTHER PUBLICATIONS

Final Office Action dated Jun. 24, 2015 from corresponding U.S. Appl. No. 13/422,736, filed Mar. 16, 2012.
(Continued)

*Primary Examiner* — David Porta
*Assistant Examiner* — Mamadou Faye
(74) *Attorney, Agent, or Firm* — Westman, Champlin & Koehler, P.A.

(57) ABSTRACT

Methods, systems, and computer readable media for tracking signals from modular sensor segments are disclosed. One system includes modular sensor segments for tracking interactions with objects where each sensor segment includes an infrared transmitter and an infrared receiver for tracking human physical interaction with objects. Each modular sensor segment includes a circuit board on which the transmitter and receiver are mounted and a light shield mounted on the circuit board configured to separate, transmit and receive optical signal paths.

17 Claims, 16 Drawing Sheets

(51) Int. Cl.
  *H01L 23/00* (2006.01)
  *G01S 17/46* (2006.01)
  *G01S 17/87* (2006.01)
  *G01S 7/481* (2006.01)

(52) U.S. Cl.
  CPC .... *H01L 24/00* (2013.01); *H01L 2924/13091* (2013.01)

(56) References Cited

U.S. PATENT DOCUMENTS

| | | | |
|---|---|---|---|
| 4,819,015 | A | 4/1989 | Bullivant et al. |
| 4,925,038 | A | 5/1990 | Gajewski |
| 5,000,274 | A | 3/1991 | Bullivant |
| 5,376,948 | A | 12/1994 | Roberts |
| 5,450,971 | A | 9/1995 | Boron et al. |
| 5,549,373 | A | 8/1996 | Bustos |
| 5,645,182 | A | 7/1997 | Miller, Jr. et al. |
| 5,781,443 | A * | 7/1998 | Street et al. ............ 700/214 |
| 6,184,521 | B1 * | 2/2001 | Coffin et al. ............ 250/237 R |
| 6,296,523 | B1 * | 10/2001 | Sasai ............ 439/660 |
| 6,332,575 | B1 | 12/2001 | Schuessler et al. |
| 6,588,606 | B2 | 7/2003 | Miller, Jr. et al. |
| 6,688,478 | B2 | 2/2004 | Miller, Jr. et al. |
| 6,752,277 | B1 | 6/2004 | Sempliner |
| 6,877,618 | B2 | 4/2005 | Mason |
| 6,878,896 | B2 | 4/2005 | Esslinger et al. |
| 6,886,746 | B1 | 5/2005 | Edwards |
| 7,268,692 | B1 * | 9/2007 | Lieberman ............ B65G 1/137 340/555 |
| 7,322,520 | B2 | 1/2008 | Warden et al. |
| 7,516,848 | B1 | 4/2009 | Shakes et al. |
| 7,561,717 | B2 | 7/2009 | Anderson |
| 7,584,016 | B2 | 9/2009 | Weaver |
| 7,693,757 | B2 | 4/2010 | Zimmerman |
| 7,994,914 | B2 | 8/2011 | Irmscher et al. |
| 8,025,187 | B2 | 9/2011 | Sottosanti, Jr. et al. |
| 8,651,288 | B2 | 2/2014 | Squitieri |
| 2002/0161651 | A1 | 10/2002 | Godsey et al. |
| 2003/0001223 | A1 * | 1/2003 | Gremm ............ H03K 17/94 257/444 |
| 2003/0038099 | A1 | 2/2003 | Bauman et al. |
| 2004/0098298 | A1 | 5/2004 | Yin |
| 2004/0254759 | A1 | 12/2004 | Kubach et al. |
| 2005/0103850 | A1 | 5/2005 | Mergenthaler et al. |
| 2005/0131578 | A1 | 6/2005 | Weaver |
| 2005/0171854 | A1 | 8/2005 | Lyon |
| 2005/0177423 | A1 | 8/2005 | Swanson, Sr. |
| 2005/0270149 | A1 | 12/2005 | Standing |
| 2005/0286220 | A1 | 12/2005 | Moore et al. |
| 2006/0071774 | A1 | 4/2006 | Brown et al. |
| 2006/0092042 | A1 | 5/2006 | Davis et al. |
| 2006/0216138 | A1 | 9/2006 | Schaefer |
| 2006/0238307 | A1 | 10/2006 | Bauer et al. |
| 2007/0050271 | A1 | 3/2007 | Ufford et al. |
| 2007/0067203 | A1 | 3/2007 | Gil et al. |
| 2007/0193971 | A1 | 8/2007 | Hardy et al. |
| 2007/0255665 | A1 | 11/2007 | Dosugi et al. |
| 2008/0082360 | A1 | 4/2008 | Bailey et al. |
| 2008/0159634 | A1 | 7/2008 | Sharma et al. |
| 2008/0186167 | A1 | 8/2008 | Ramachandra |
| 2008/0186174 | A1 | 8/2008 | Alexis et al. |
| 2009/0179753 | A1 | 7/2009 | Bonner et al. |
| 2009/0192921 | A1 | 7/2009 | Hicks |
| 2009/0207022 | A1 | 8/2009 | Reckeweg et al. |
| 2009/0233714 | A1 * | 9/2009 | Toro ............ 463/39 |
| 2009/0294479 | A1 | 12/2009 | Sottosanti, Jr. et al. |
| 2010/0010868 | A1 | 1/2010 | Aimone Catti |
| 2010/0023300 | A1 | 1/2010 | Farry et al. |
| 2010/0065632 | A1 | 3/2010 | Babcock et al. |
| 2010/0139989 | A1 | 6/2010 | Atwater et al. |
| 2010/0327164 | A1 | 12/2010 | Costello et al. |
| 2011/0010275 | A1 | 1/2011 | Hull |
| 2012/0185590 | A1 | 7/2012 | Kolin et al. |
| 2012/0245969 | A1 | 9/2012 | Campbell |
| 2013/0117053 | A2 | 5/2013 | Campbell |
| 2014/0110584 | A1 | 4/2014 | Campbell |
| 2014/0114708 | A1 | 4/2014 | Campbell |
| 2014/0289009 | A1 | 9/2014 | Campbell |
| 2015/0134996 | A1 * | 5/2015 | Pitigoi-Aron ............ G06F 1/329 713/400 |

FOREIGN PATENT DOCUMENTS

| | | |
|---|---|---|
| JP | 09-288764 A | 11/1997 |
| JP | 2008-247558 A | 10/2008 |
| KR | 10-1998-0074218 A | 11/1998 |
| KR | 10-0935341 B1 | 1/2010 |
| WO | WO 2012/125960 A2 | 9/2012 |
| WO | WO 2014/107457 A1 | 7/2014 |
| WO | WO 2014/107462 A1 | 7/2014 |

OTHER PUBLICATIONS

Final Office Action dated Jan. 29, 2016 for corresponding U.S. Appl. No. 14/145,561.
Non-Final Office Action dated Mar. 23, 2016 for U.S. Appl. No. 13/422,736.
Non-Final Office Action dated Aug. 29, 2016 for U.S. Appl. No. 14/145,649.
Non-Final Office Action dated Oct. 25, 2016 for U.S. Appl. No. 14/145,561.
Non-Final Office Action and Examiner-Initiated Interview Summary for U.S. Appl. No. 14/145,561 (dated Apr. 6, 2015).
Applicant-Initiated Interview Summary for U.S. Appl. No. 13/422,736 (dated Mar. 18, 2015).
Notification of Transmittal of the International Search Report and the Written Opinion of the International Searching Authority, or the Declaration for International Application No. PCT/US2014/072776 (dated Mar. 12, 2015).
Non-Final Office Action for U.S. Appl. No. 13/422,736 (dated Dec. 2, 2014).
Non-Final Office Action for U.S. Appl. No. 13/422,736 (dated Jul. 18, 2014).
First Examination Report for New Zealand Patent Application No. 614984 (dated Jul. 14, 2014).
Notification of Transmittal of the International Search Report and the Written Opinion of the International Searching Authority, or the Declaration for International Application No. PCT/US2013/078529 (dated Apr. 29, 2014).
Notification of Transmittal of the International Search Report and the Written Opinion of the International Searching Authority, or the Declaration for International Application No. PCT/US2013/078509 (dated Apr. 24, 2014).
Communication of European Publication Number and Information on the Application of Article 67(3) EPC for European Patent Application No. 12717507.3 (dated Jan. 15, 2014).
"Snackmaker Modernizes the Impulse Buy with Sensors, Analytics," CIO Journal, The Wall Street Journal, pp. 1-3 (Oct. 11, 2013).
Notification of Transmittal of the International Search Report and the Written Opinion of the International Searching Authority, or the Declaration for International Application No. PCT/US12/29518 (dated Sep. 21, 2012).

* cited by examiner

| SELF ID V | FUNCTION |
|---|---|
| 4.5 | DIFFUSE IR REFLECTION PICKUP |
| 4.0 | INFRARED RANGE FINDER PROXIMITY |
| 3.5 | ULTRASONIC RANGE FINDER PROXIMITY |
| 3.0 | WEIGHT |
| 2.5 | PASSIVE INFRARED |
| 2.0 | START OF LEFT TO RIGHT SECTION |
| 1.5 | START OF RIGHT TO LEFT SECTION |

FIG. 7

BASIC CIRCUIT FOR DIFFUSE INFRARED REFLECTANCE PICKUP SENSOR

DIFFUSE INFRARED REFLECTANCE PICKUP SENSOR WITH SELF IDENTIFICATION

METHODS, SYSTEMS, AND COMPUTER READABLE MEDIA FOR TRACKING HUMAN INTERACTIONS WITH OBJECTS USING MODULAR SENSOR SEGMENTS

PRIORITY CLAIM

This application claims the benefit of U.S. Patent Application Ser. No. 61/923,113, filed Jan. 2, 2014, the disclosure of which is incorporated herein by reference in its entirety.

TECHNICAL FIELD

The subject matter described herein relates to modular sensor segments. More particularly, the subject matter described herein relates to tracking human interactions with objects using modular sensor segments.

BACKGROUND

CPG manufacturers and retailers are increasingly interested in embedding sensor systems into real retail environments to study the interactions between shoppers, displays and products. The learnings from such studies yield valuable insights that can be applied to optimize product range, displays and the overall shopper experience. Such embedding of sensor systems into retail environments presents a number of challenges, including but not limited to how to embed a large number of sensors, how to minimize the sensors' form factor and cost, how to seamlessly integrate different types of sensors, how to effectively bring power and data connections to those different sensors, how to minimize the amount of wiring required, how to bring about fast and efficient installation, removal and changes to sensor arrays. A need exists to address the problems noted above and other problems previously experienced.

SUMMARY

The subject matter described herein includes methods, systems, and computer readable media for tracking human interactions with objects using modular sensor segments are disclosed. One exemplary system includes modular sensor segments where each sensor segment includes an infrared transmitter and an infrared receiver for tracking human physical interaction with objects. Each modular sensor segment includes a circuit board on which the transmitter and receiver are mounted and a light shield mounted on the circuit board configured to separate transmit and receive optical signal paths.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which:

FIG. 7 is a table illustrating voltages for self-identification of modular sensor segments according to an embodiment of the subject matter described herein;

DETAILED DESCRIPTION

Figure 1:
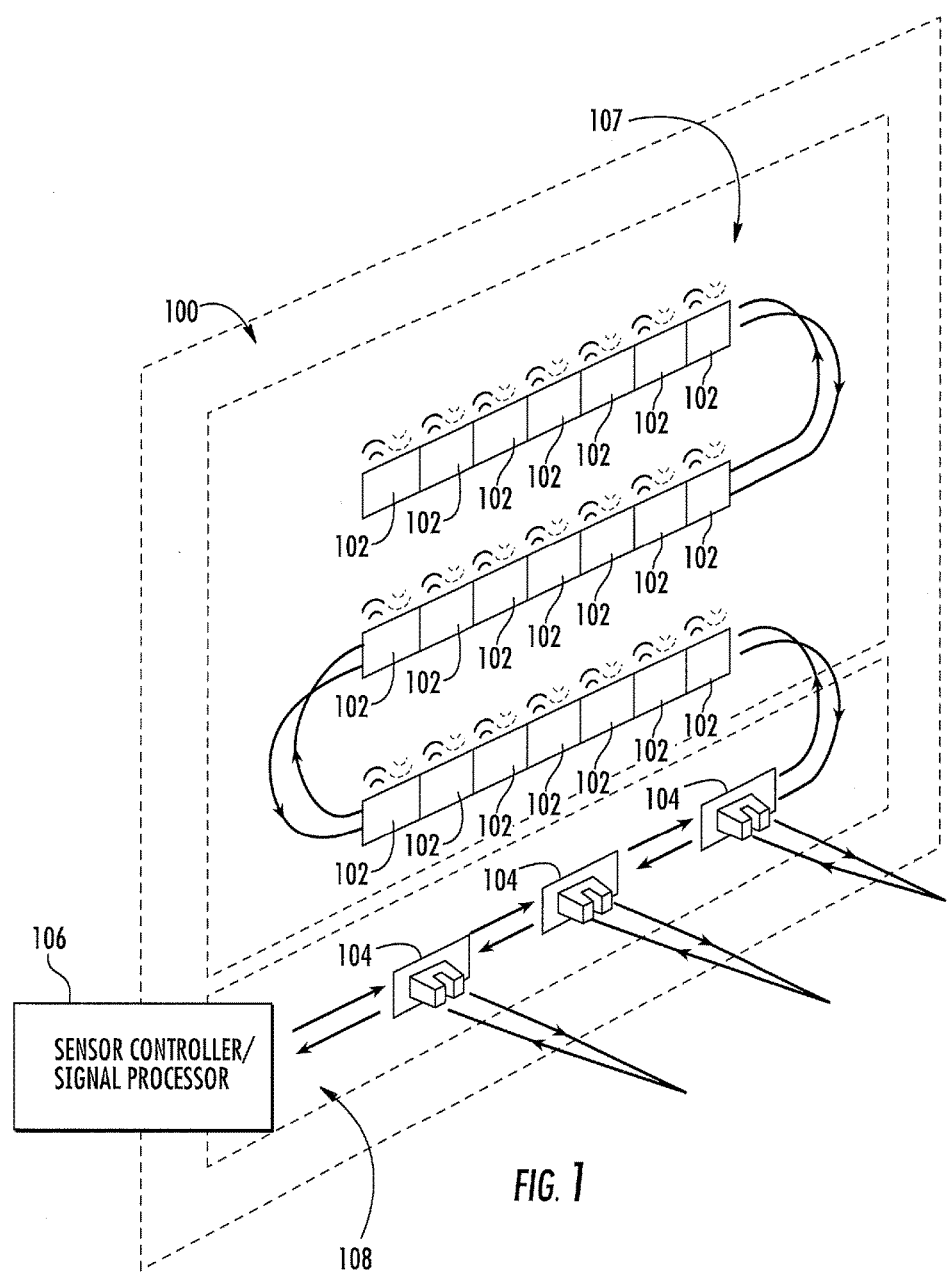
FIG. 1 is a schematic diagram illustrating a plurality of modular sensor segments including range and proximity sensors according to an embodiment of the subject matter described herein.

The subject matter described herein includes methods, systems, and computer readable media for tracking human interaction with objects using modular sensor segments. FIG. 1 is a schematic diagram illustrating a plurality of modular sensor segments configured to track human interaction with objects according to an embodiment of the subject matter described herein. In the illustrated configuration, the sensor segments may be used to detect consumer interaction with product units on a retail shelf. Referring to FIG. 1, system 100 includes a plurality of diffuse infrared pickup sensors 102 and infrared range finding proximity sensors 104 connected in a series with each other to detect consumer events associated with a retail shelf. Within the pickup sensing portion of the system, 107, each row of pickup sensors 102 may be aligned with the front of a shelf strip on a retail shelf. Within the proximity sensing portion of the system, 108, an array of proximity sensors may be positioned so as to detect the presence and range of shoppers passing by the display, for example along the edge of a store counter, or at waist height in an aisle section of the store. As will be described in detail below, each diffuse infrared pickup sensor includes an infrared transmitter and a detector. The infrared transmitter and detectors would each face upward in a direction orthogonal to the direction that a user's hand would enter a shelf to pick a product. Each infrared proximity sensor 104 also includes an infrared transmitter and a detector where the transmitter and detector are oriented to point outward from the display to detect a user's position relative to the display. A sensor controller/signal processor 106 may receive the signals from sensors 102 and 104 and process the signals to identify types of human interactions with objects. For example, sensor controller/signal processor 106 may differentiate between product pickup and putback events, identify the range of an object, and/or identify the size of an object based on signals output from sensors 102. Sensor controller/signal processor 106 may also differentiate between proximity events, for example entry of a shopper into the monitored area, exit of the shopper from the monitored area, "fixations" where a shopper stands still at a point in the area for a prescribed length of time and "transitions" when shoppers move between fixations based on signals output from sensors 104. Sensor controller/signal processor 106 may control the illumination by sensors 102 and 104 by selectively or continually sending an illuminate signal to sensors 102 and 104. Sensor controller/signal processor 106 may also poll sensors to determine sensor types using sensor self identification circuits that may be embedded within each modular sensor segment.

Figure 2:
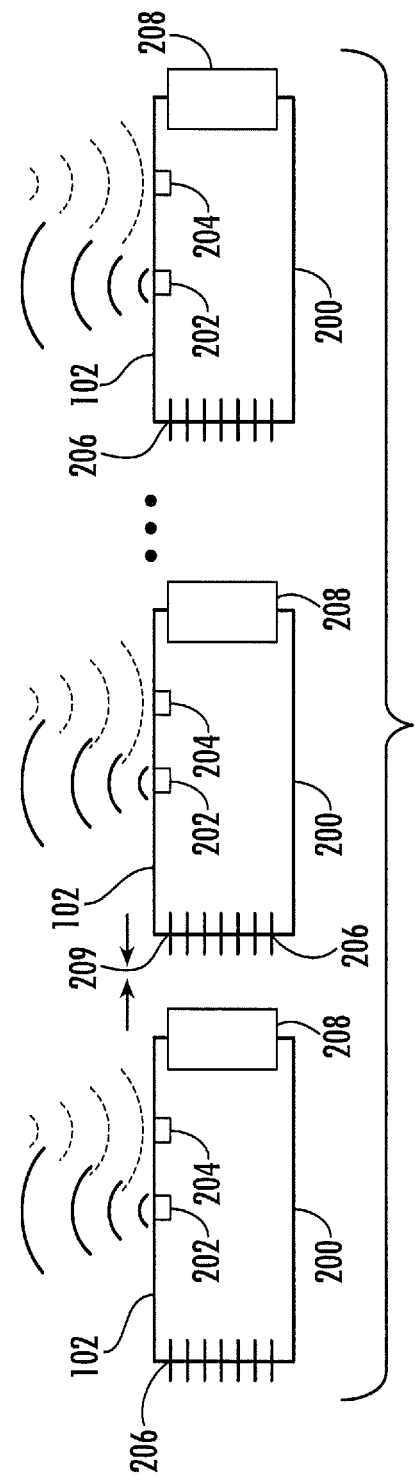
FIG. 2 is a schematic diagram illustrating modular sensor segments according to an embodiment of the subject matter described herein.

FIG. 2 is a schematic diagram illustrating that diffuse infrared pickup detection sensors 102 and proximity sensors 104 may be configured as modular segments 200 that are removably connectable to each other 209. In the illustrated example, each modular segment 200 includes an infrared transmitter 202, an infrared receiver 204, a male connector 206, and a female connector 208. Each segment 200 may also include signal lines and additional circuitry for transmitting power and signals between shelves and for identifying the type of each sensor, which will be described in more detail below.

Because segments 200 are removably connectable to each other and have a common signal bus, sensor arrays of different types can be created. For example, infrared pickup detection and proximity sensors may be connected together to form an array that identifies pickup and putback events and that movements of a shopper within range of a retail product configuration.

Modular sensor segments may be connected in any order—for example a series of personnel range finders followed by a series of pickup sensors. Modular sensor segments may be printed in series on a printed circuit board (PCB), directly connected one to each other, joined by jumpers, or joined by a wireless interconnections, such as Bluetooth or Wi-Fi connections. All segments will typically have a standard pinout—one on the input side, one on the output side. All segments will typically have a male and female connector at either end. In some embodiments, header pins may be configured and female sockets may be keyed to ensure correct connection of segments in the proper pin-to-pin match.

Figure 3A:
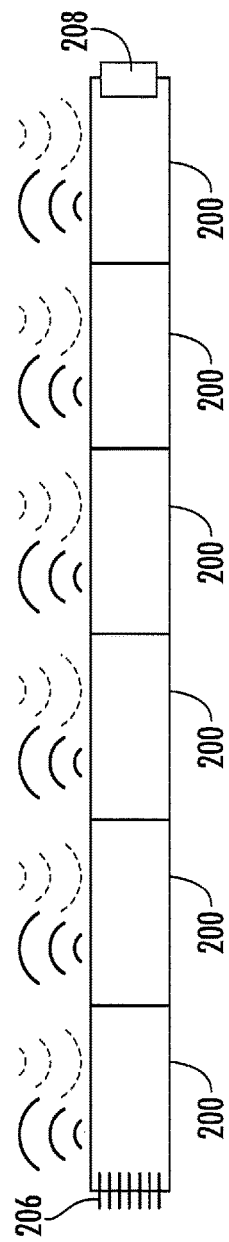
FIGS. 3A-3C illustrate examples of interconnections between modular sensor segments according to an embodiment of the subject matter described herein.
Figure 3B:
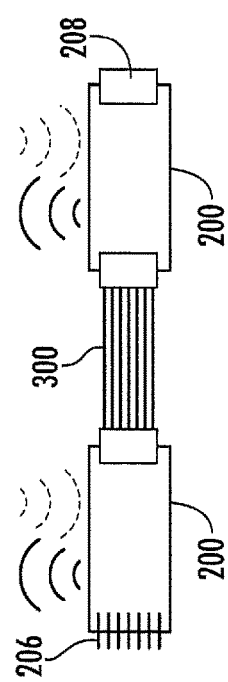
Figure 3C:
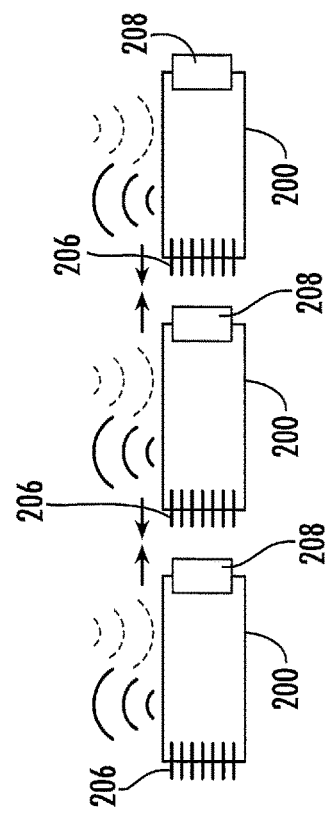

FIG. 3 is a schematic diagram illustrating exemplary methods for interconnecting sensor segments 200. In FIG. 3A, multiple sensor segments 200 are printed on the same printed circuit board with a male connector 206 located on one end of the circuit board and a female connector 208 located on the other end of the circuit board. In FIG. 3B, adjacent sensor segments 200 are connected via jumper wires 300. The arrangement in FIG. 3B may be used to interconnect sensor segments between shelves and/or interconnect sensors on the same shelf when it is desirable to space sensors from each other on the same shelf. In FIG. 3C, adjacent sensor segments 200 are directly connected to each other via their respective connectors 206 and 208.

In some embodiments of diffuse infrared reflection sensors, each sensor segment may have a fixed length. Initially several sections are produced in a length of sensor stock either on PCB or flexible circuit board (flex circuit). Sections may be cut to length and header pins attached. Sections may be cut to length or clicked together to form an appropriate run length for any given length of shelf. Right angle headers may be used to turn right angle corners, or any angle of choosing. It should also be noted that sensor circuitry may be printed on a flexible substrate, such as a flexible printed circuit board that is cut to length to match the desired planogram. On either a flexible or rigid substrate, perforations may be formed between adjacent sensor segments to allow rapid manual separation of sensor segments without the need for tools to effect the separation.

Figure 4A:
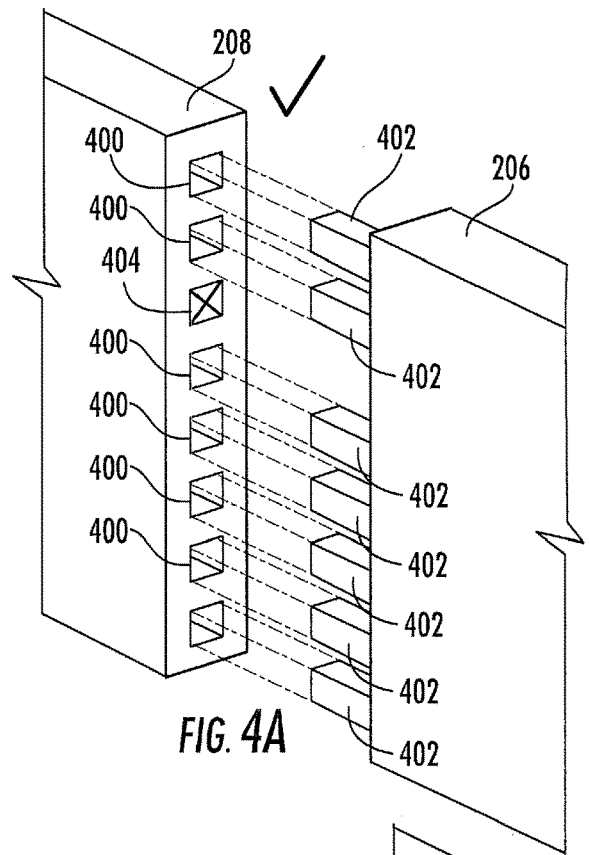
FIGS. 4A and 4B illustrate exemplary keying of connectors between modular sensor segments according to an embodiment of the subject matter described herein.
Figure 4B:
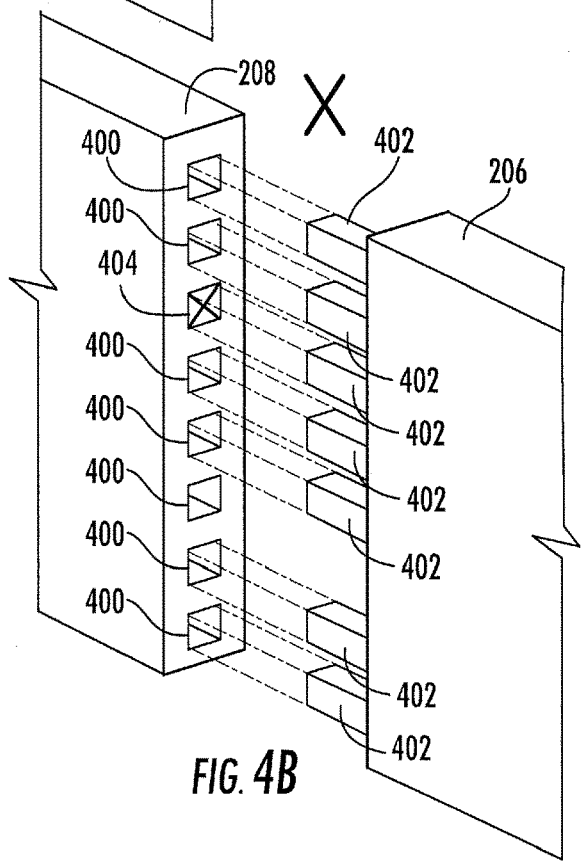

According to another aspect of the subject matter described herein, female connectors 208 may be keyed to prevent improper connection. FIGS. 4A and 4B illustrate exemplary keying. In FIGS. 4A and 4B, female connectors 208 include a plurality of sockets 400 for receiving corresponding pins 402 on male connectors 206. However, one of the sockets 404 off center from the middle of each female connector may be blocked such that male and female connectors 206 and 208 cannot be improperly joined as illustrated in FIG. 4B.

Figure 5:
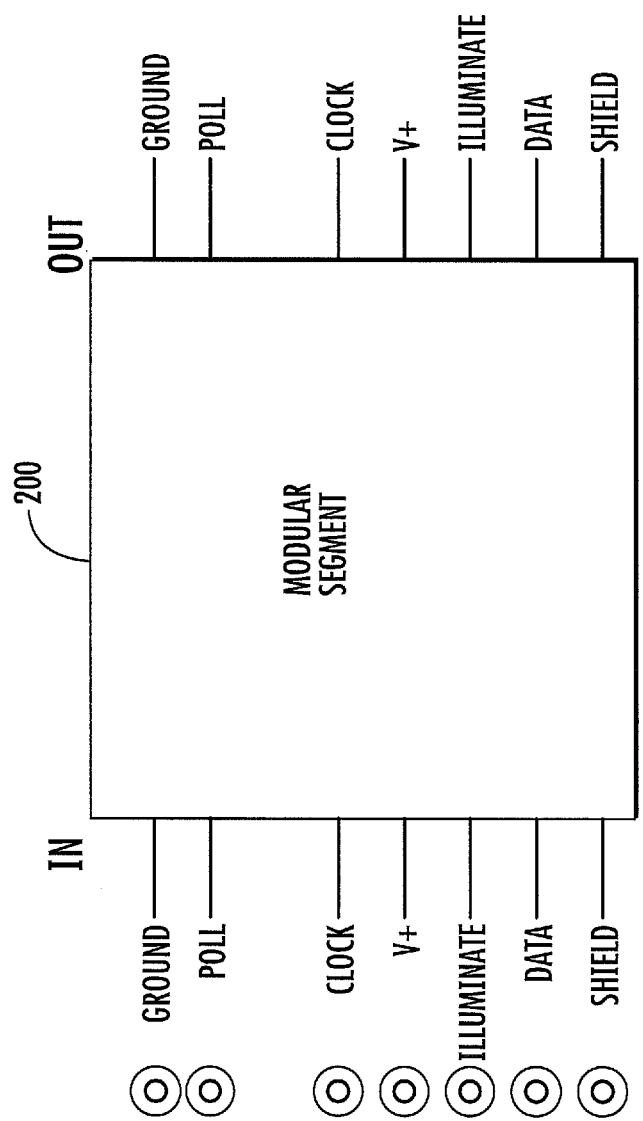
FIG. 5 is a schematic diagram illustrating exemplary signals of a modular sensor segment according to an embodiment of the subject matter described herein.
Figure 6A:
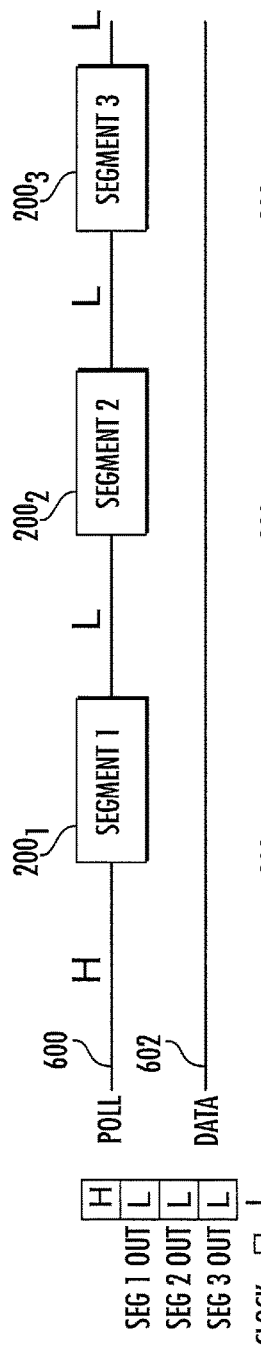
FIGS. 6A-6D illustrate polling of modular sensor segments according to an embodiment of the subject matter described herein.
Figure 6B:
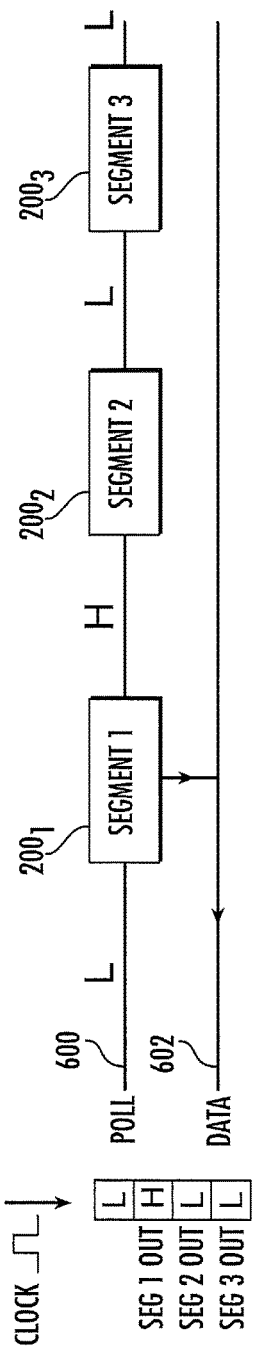
Figure 6C:
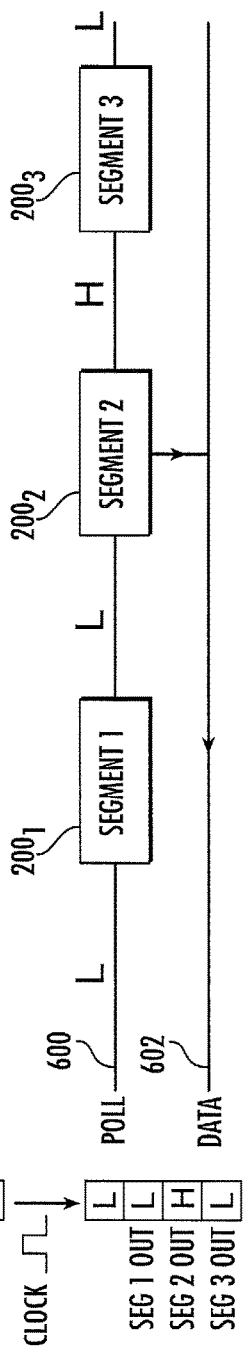
Figure 6D:
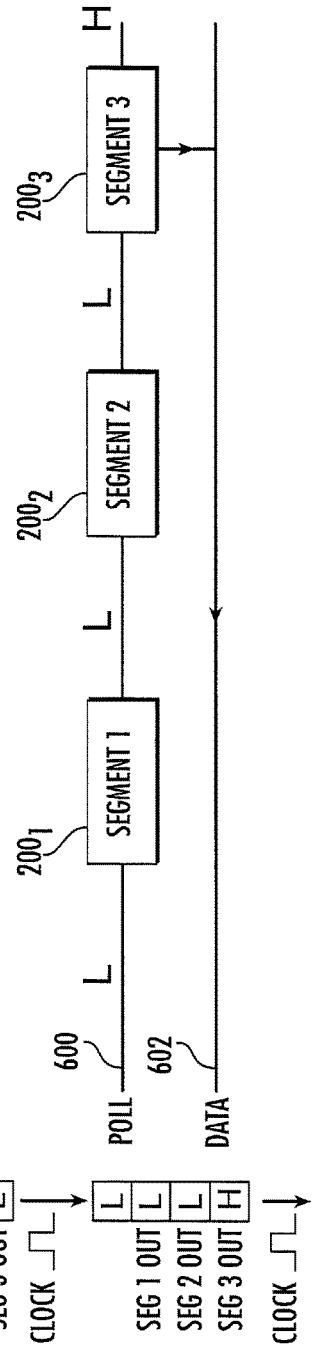

According to another aspect of the subject matter described herein, the modular sensor segments 200 may be connected via a single common bus. An exemplary configuration of the bus is illustrated in FIG. 5. In FIG. 5, modular sensor segment 200 includes a 7-conductor bus. The conductors include conductors for ground, polling, clock, power, illumination, data, and shielding. Alternate configurations are possible without departing from the scope of the subject matter described herein.

In one embodiment of the subject matter described herein, sensors do not need to be monitored continuously and need only be polled intermittently. Each segment is polled one at a time in sequence until all segments have been polled—at which point the logging system begins by polling the first segment again. The utility of such a bus arrangement allows rapid customization of the sensor array while minimizing the number of data lines required. As a result, equipment cost and scale are reduced relative to parallel monitoring of all sensors. Using a common sensor bus also eliminates the cost of having a local analog to digital converter for each sensor segment and allows identification of a sensor's physical location simply by its position in the polling sequence.

Each segment receives appropriate power from the bus. The bus contains one or more data lines to which each sensor is connected sequentially, one sensor at a time. The sensor segment may send a signal to the data line in the form of a voltage, a current, a pulse stream, a digital stream or any other form of sensor communication protocol.

Sequential polling may be realized by means of a clock signal and a poll signal. The clock signal cycles high and low on a prescribed frequency. At the start of a polling cycle, the poll signal is sent high for the first sensor segment. The high poll signal is used to activate connection of the first sensor to the data bus and if required switch on any active components in the sensor. On the next clock cycle, the poll signal is propagated to the second segment. The poll signal for the first section is sent low, which disables the data connection and active power to that segment. Such a propagation may be readily realized with a flip-flop onboard each segment. The cycle repeats for segment 3 to N.

FIG. 6 is a timing diagram illustrating exemplary polling of adjacent sensor segments $200_1$, $200_2$, and $200_3$. The clock signal cycles high and low at its clock frequency. At the start of a polling cycle, the poll signal is set high for the first sensor segment. In the example illustrated in FIG. 6A, the poll signal 600 is initially high for segment $200_1$ and low for segments $200_2$ and $200_3$. The high poll signal activates connection of the sensor in segment $200_1$ to the data bus 602. On the next clock signal, the high poll signal is propagated to the second sensor segment $200_2$ as indicated in FIG. 6B. This high poll signal activates connection of the sensor in segment $200_2$ to its respective data bus 602. In FIG. 6C, the high poll signal is propagated to the last sensor segment $200_3$. In FIG. 6D, the poll sensor of segment $200_3$ is connected to its data bus 602. Such propagation may be readily realized with a flip flop on each sensor segment, which will be described below. The cycle repeats for each segment in a given sensor arrangement.

In some embodiments, it may be desirous to take readings from a sensor segment with its transmitter on and also with its transmitter off. This is of utility with infrared sensors allowing factoring out of background illumination. In these embodiments, an illuminate signal may be used to switch on illumination of the transmitter for the currently polled segment. Such illumination may be readily realized with a transistor, such as a MOSFET, onboard each segment. Two readings are then taken for each segment—one with the transmitter on and one with the transmitter off. The first reading taken with the transmitter off may be used to determine the level of interference from ambient or background illumination. The second reading taken with the transmitter on represents the sum of the background illumination and light from the transmitter that is coupled to the receiver. Reading 1 may then be subtracted from reading 2 resulting in a measure of the true reflected illumination absent any ambient interference.

In some embodiments, it may be desirous to modulate the transmitted infrared signal and detect only modulated reflections. This is of utility with infrared sensors allowing factoring out of background illumination and also allows extended range versus just using an illuminate signal.

In these embodiments, an illuminate signal may be realized with a modulated pulsed signal to the transmitter and a modulation filter in the receiver line. In one such embodiment the receiver may output a logical HI or LO signal indicating whether or not a modulated reflection has been received. With a HI//LO receiver device, the strength of the transmitted signal may be varied to as to triangulate exact range. In another such embodiment the receiver may output an analog signal proportional to the strength of the modulated signal.

The serial bus arrangement may be extended for use with many different types of input sensors, including pickup sensors (operating for example on the basis of infrared diffuse reflectance, infrared range finders, or weight), shopper position sensors (operating for example on the basis of general presence (PIR), range (ultrasonics, infrared range finders), shopper attribute sensors (for example shopper height, width, weight), audio sensors (e.g. microphone), video sensors (e.g. camera), environmental characteristic sensors (for example temperature, humidity, air quality, ambient lighting).

The serial bus principle may also be used to transfer data from the signal processor to an output device mounted on a modular segment, for example a price for display on a price segment, an image frame display on an on-shelf video device, a QR code for display on an on-shelf device, switching commands for a lighting system, an audio stream, a video stream. In some embodiments when communicating with a digital segment, the data line and illuminate line can become RX/TX serial lines.

The serial bus may also be used to transmit other types of data to signal processor 106—for example audio feed from a microphone or video frames from a camera.

In some embodiments, functionality may be included to identify the specific type of sensor connected at a specific location on the sensor bus—for example weight pickup, proximity, infrared pickup. This is of utility in allowing rapid customization of a sensor array in the field by: allowing a logging system to self-detect the structure of the sensor network without manual input, by automatically validating the structure of sensor arrays vs. plan and so providing a system installer with instant feedback, by providing ongoing diagnostics, by communicating with the sensor appropriately to its sensor type, by selecting an appropriate method to measure the received sensor signal (e.g. current, voltage, pulse stream, digital), by selecting an appropriate conversion to apply to that signal, by detecting the end of an array of sensors and beginning the polling of the sensor array over again.

In such embodiments, each sensor segment may be polled over the course of two clock cycles. On the first cycle, the sensor segment transmits a fixed signal (e.g. voltage or current), the value of which is indicative of a particular type of sensor. Once the sensor type has been identified, the clock cycle may advance and on the second cycle the sensor is connected to the data line and a measurement made accordingly.

Providing sensor self identification allows for an efficient use of wiring—sensors of any type may be included in the array at any location, making it possible to join nearby sensors in any order irrespective of their type, rather than for example wiring all proximity sensors together, all pickup sensors together, etc., which would require longer and redundant wiring. This results in a reduction in visible wiring, simplified installation, simplified modification of the network and reducing the potential for signal loss/electromagnetic interference (EMI) through shorter wiring runs.

In some embodiments self-identification segments may be included to identify a change in shelf direction—for example from left to right, or from right to left. This is useful as it allows the logging system to detect the exact structure of the sensor array and validate that array against plan. This may be realized in several ways, each of which may use a specific self-identification signal (e.g. voltage current, pulse pattern to signify the appropriate type of transition). Examples include segments with fixed resistors to indicate right to left, or left to right or alternatively segments with manual switches allowing user selection of left to right, right to left.

As stated above, sensors of different types may be identified by different voltages placed on the data bus in response to a poll signal. Each sensor segment 200 may produce a voltage drop for a given bus voltage where the voltage drop across the resistor identifies the sensor type. FIG. 7 is a table illustrating exemplary bus voltages and corresponding sensor types. Referring to FIG. 7, a voltage of 4.5 volts may indicate a diffuse infrared reflective pickup sensor. A voltage of 4.0 volts may indicate an infrared range finder proximity sensor. A voltage of 3.5 volts may indicate an ultrasonic range finder proximity sensor. A voltage of 3.0 volts may indicate a weight sensor. A voltage of 2.5 volts may indicate a passive infrared sensor. A voltage of 2.0 volts may indicate the start of a left to right section. A voltage of 1.5 volts may indicate the start of a right to left section.

In some embodiments of diffuse infrared reflection sensors, some degree of light shielding around the transmitter and receiver may be included. This serves several purposes—first it reduces the amount of stray ambient infrared light reaching the receiver. Second it reduces light piping of infrared light between transmitter and receiver. Third it collimates the infrared beam into a narrow plane preventing stray reflections from extraneous objects such as the ends of product boxes. A fourth benefit is it allows identification of pickups and putbacks as will be described below.

Figure 8A:
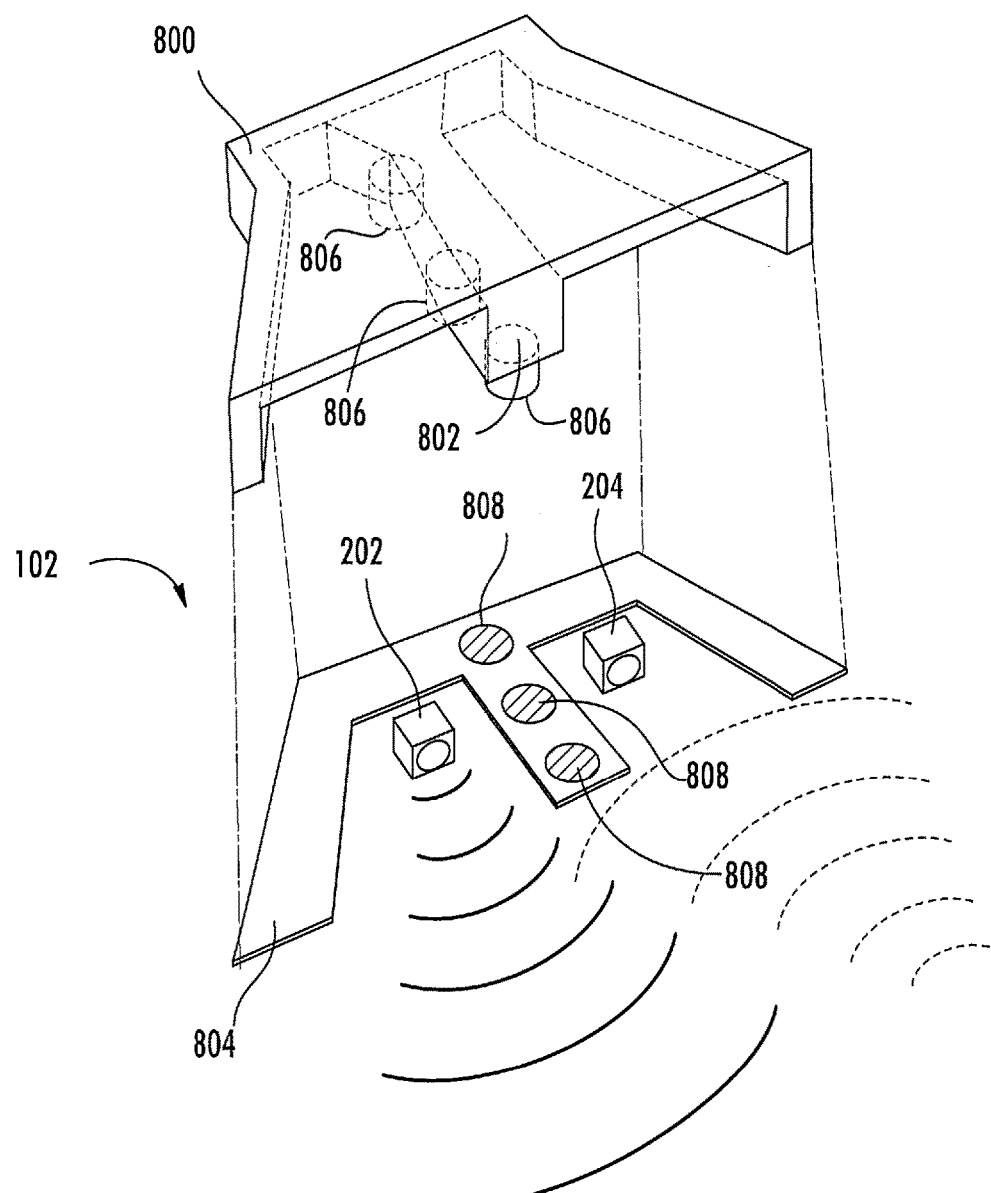
FIGS. 8A and 8B illustrate an exemplary light shield for modular sensor segment according to an embodiment of the subject matter described herein.
Figure 8B:
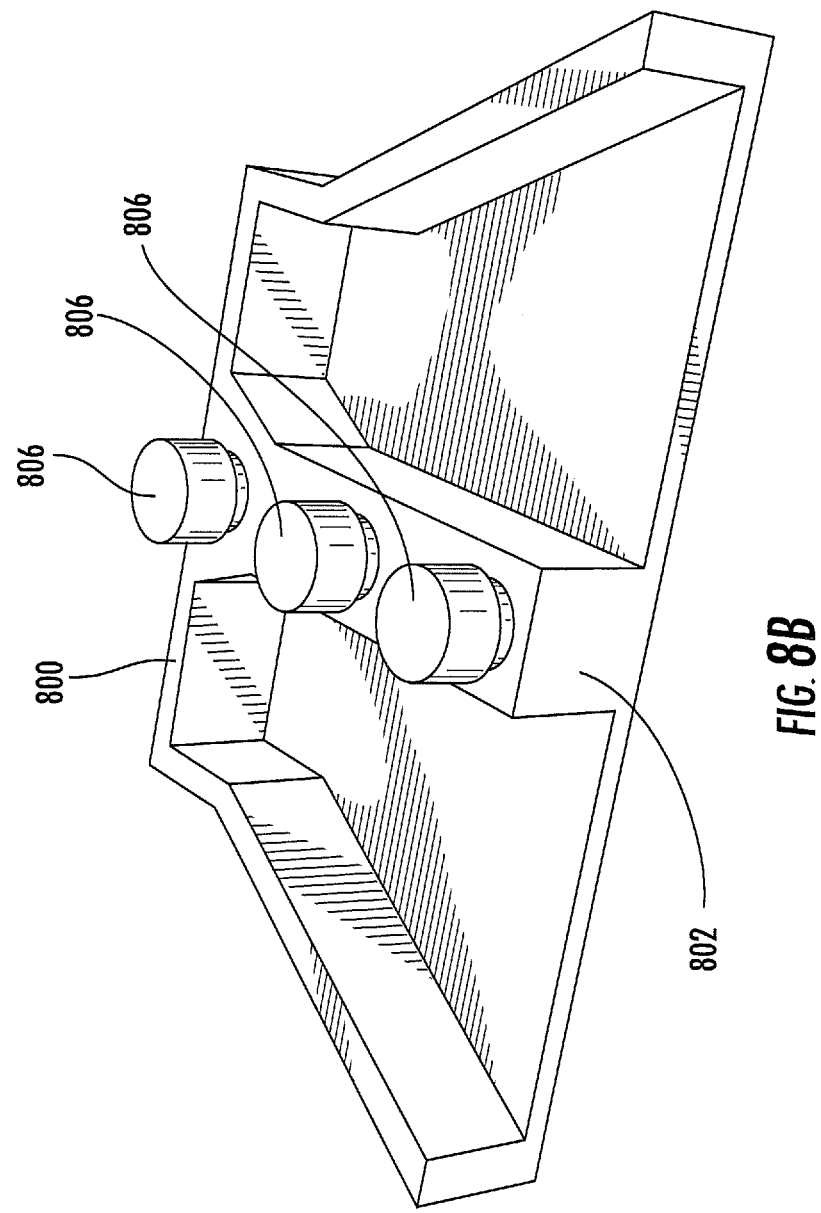

FIGS. 8A illustrates a diffuse infrared sensor 102 including infrared transmitter 202 and receiver 204. A light shield 800 covers transmitter 202 and receiver 204 in a direction that is orthogonal to the sensing direction. Light shield 800 may include a separating member 802 that is interposed between the transmit and receive light paths. Light shield 800 may be removably connectable to a footprint portion 804 located on the printed circuit board via posts 806 on the light shield 800 that fit within corresponding recesses in footprint region 804. Thus, light shield 800 may be removably connectable to footprint portion 804. FIG. 8B illustrates the underside of light shield 800. Light shield 800 may be formed of a plastic material and is opaque to the sensing frequency used by the diffuse infrared sensor.

Figure 9:
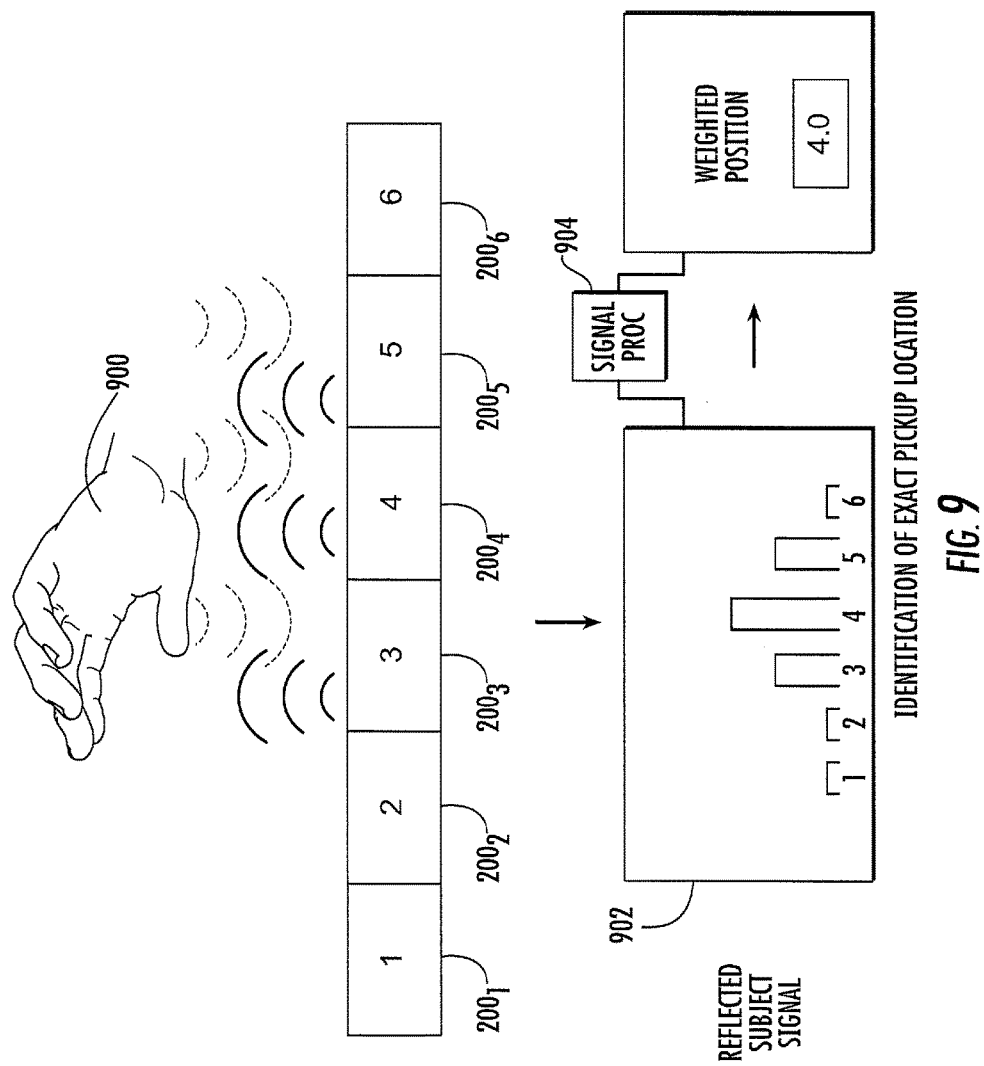
FIG. 9 is a schematic diagram illustrating the identification of a sensor which detects an object according to an embodiment of the subject matter described herein.

In some embodiments of diffuse infrared reflection sensors, with sufficiently dense sensors, multiple segments will receive a reflection from an object impinging in the detection field. By taking a weighted average of the positions of these sensors, weighted by the strength of the reflection, the x position of a pickup may be calculated with a high degree of accuracy. FIG. 9 illustrates such an embodiment. In FIG. 9, a plurality of infrared sensor segments $200_1$-$200_6$ is connected together and may line a retail shelf. When a user indicated by hand 900 reaches into the shelf, the signal from sensor and $200_4$ will be the strongest followed by the signal from $200_3$ and $200_5$, as illustrated by the signal graph 902. A signal processor 904 may weight each signal by the strength of its reflection to determine the x-position of the sensor that detected the hand with the highest accuracy. In the illustrated example, the weighted position of sensor $200_4$ is 4.0.

In some embodiments of diffuse infrared reflection sensors, it is of utility to measure the range and size of the object crossing a perimeter, such as the edge of a retail shelf on which products are placed. For example, detection of restocking or theft events when whole containers of products may be added/removed from the shelf. Size may be estimated from the number of sensors triggered and also the strength of the reflected signaled. Range may be estimated by the strength of reflected signal from the sensor closest to the pickup location object. A simple calibration is possible to allow the inference of both range and size.

Figure 10A:
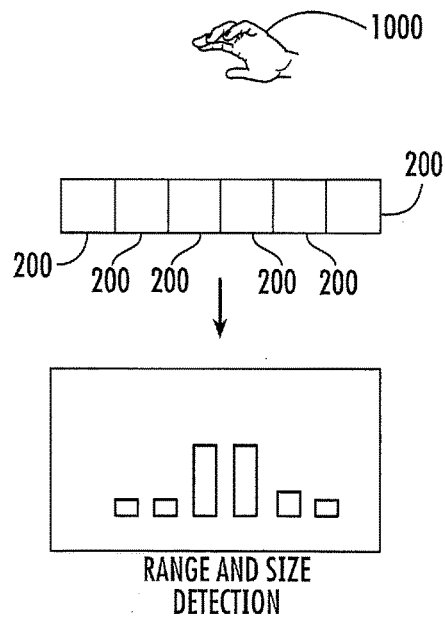
FIGS. 10A-10D are schematic diagrams and graphs illustrating detection of object size and proximity using modular sensor segments according to an embodiment of the subject matter described herein.
Figure 10B:
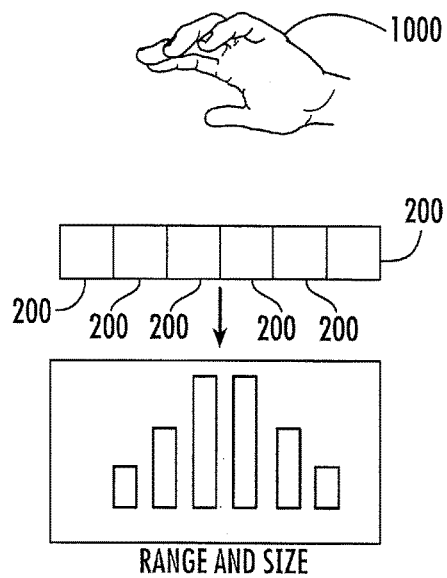
Figure 10C:
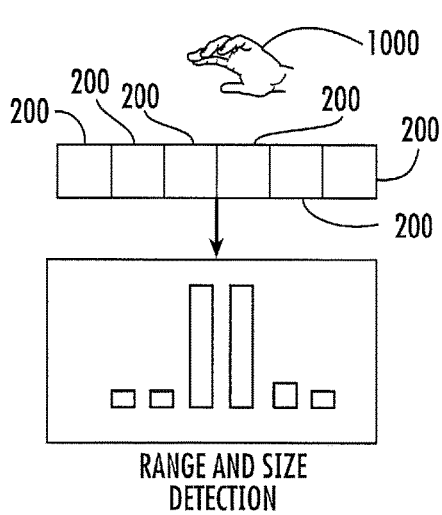
Figure 10D:
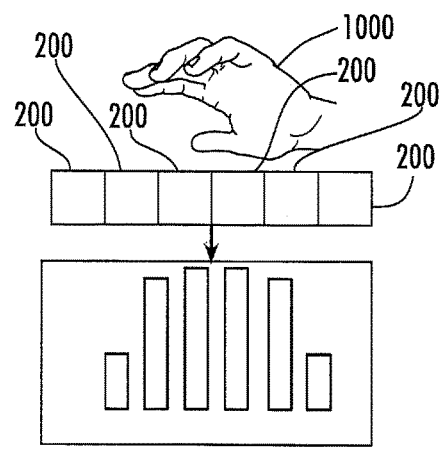

FIGS. 10A-10D illustrate the use of diffuse infrared reflection sensors to detect object range and size. Referring to FIGS. 10A and 10B, range can be estimated by the strength of the signal closest to the pickup object. Size can be estimated by the number of sensors triggered. In FIG. 10A, a small object that is far away will produce a modest signal on the two sensor segments 200 closest to the object. In FIG. 10B, large object 1000 that is far away from sensors 200 will produce a stronger signal across four sensor segments 200. In FIG. 10C, a small object that is close to sensor segments 200 produces a strong signal across 2 of the central segments, whereas a large object close to sensor segments 200 as illustrated in FIG. 10D produces a large signal across 4 sensor segments.

In some embodiments of infrared diffuse reflection sensors, the signal received from the sensor may be analyzed to determine whether a pickup or putback takes place. In one embodiment, an infrared pickup sensor may be installed on a shelf lip facing up. The logging system tracks the voltage from start to finish of an event. The logged signal will show peaks and valleys corresponding to proximity of either shopper's hand and or object throughout the event. In the majority of cases, when an object is in the shopper's hand, an extremely strong reflection will be caused resulting in a peak in the logged signal. During a pickup this peak will occur toward the end of the event whereas during a putback the peak will occur at the beginning. By spotting the peak and whether it occurs at the start or end of the event, the logging system can accurately determine whether a pickup or putback has occurred. The clarity of the peak is particularly sharp when a light shield is used to collimate the sensor radiation into a narrow plane. This ability to separate pickups and putbacks eliminates the need for costly and bulky weight sensors to be installed under the product facing, accomplishing the same end with a low form factor device. By allowing lower cost and more discrete installation this expands the range of possible applications of this system.

Identification of pickups from putbacks may also be accomplished in the case of hang sell items by having two sensors—if the inner sensor is occluded first, this indicates a pickup; if the outer sensor is occluded first, this indicates a putback.

Figure 11A:
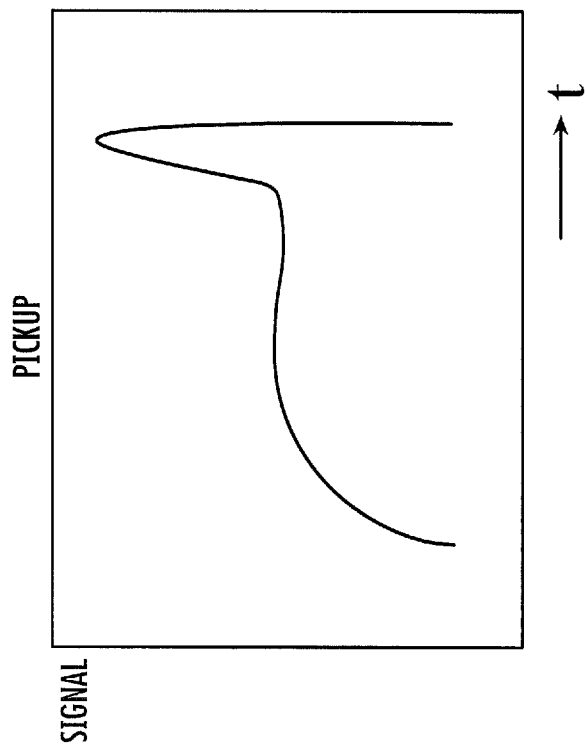
FIGS. 11A and 11B are graphs distinguishing pickup and put back events using modular sensor segments according to an embodiment of the subject matter described herein.
Figure 11B:
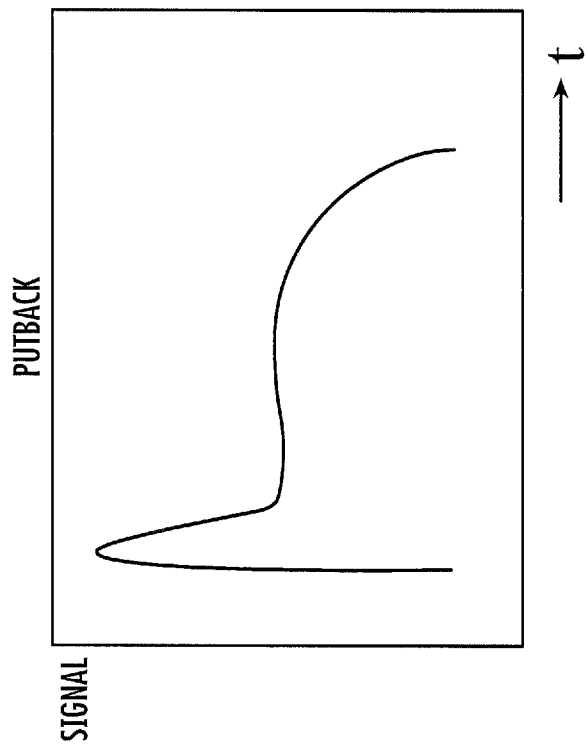

FIGS. 11A and 11B illustrate exemplary signals that may be used to distinguish between pickup and putback events according to an embodiment if the subject matter described herein. In FIG. 11A, a pickup event is illustrated by an increase in signal amplitude versus time with a spike at the end when the product unit covers the output of the sensor. In FIG. 11B, a putback event is illustrated by a spike at the beginning of the time period when the product unit covers the sensor followed by a period where the user's hand or arm covers the sensor and then is removed from the sensor detection area.

A particularly useful embodiment of modular sensing may be constructed with a series of range finding devices on a close pitch. If these are connected at a fine enough pitch, it is possible to create a 2-D scanning system with a range of up to three meters which is useful for pickup tracking on large displays. Infrared range finders, ultrasonic range finders or any other range finding device may be used. Generally infrared are preferred as they measure in a narrow beam and allow more accurate sensing of position. Such a device may be conveniently mounted over the top of a display section, underneath or to the side as best fits the dimensions of the segment. Overhead mounting is generally least visible or obtrusive and may be integrated into a light fixture or header card.

Figure 12:
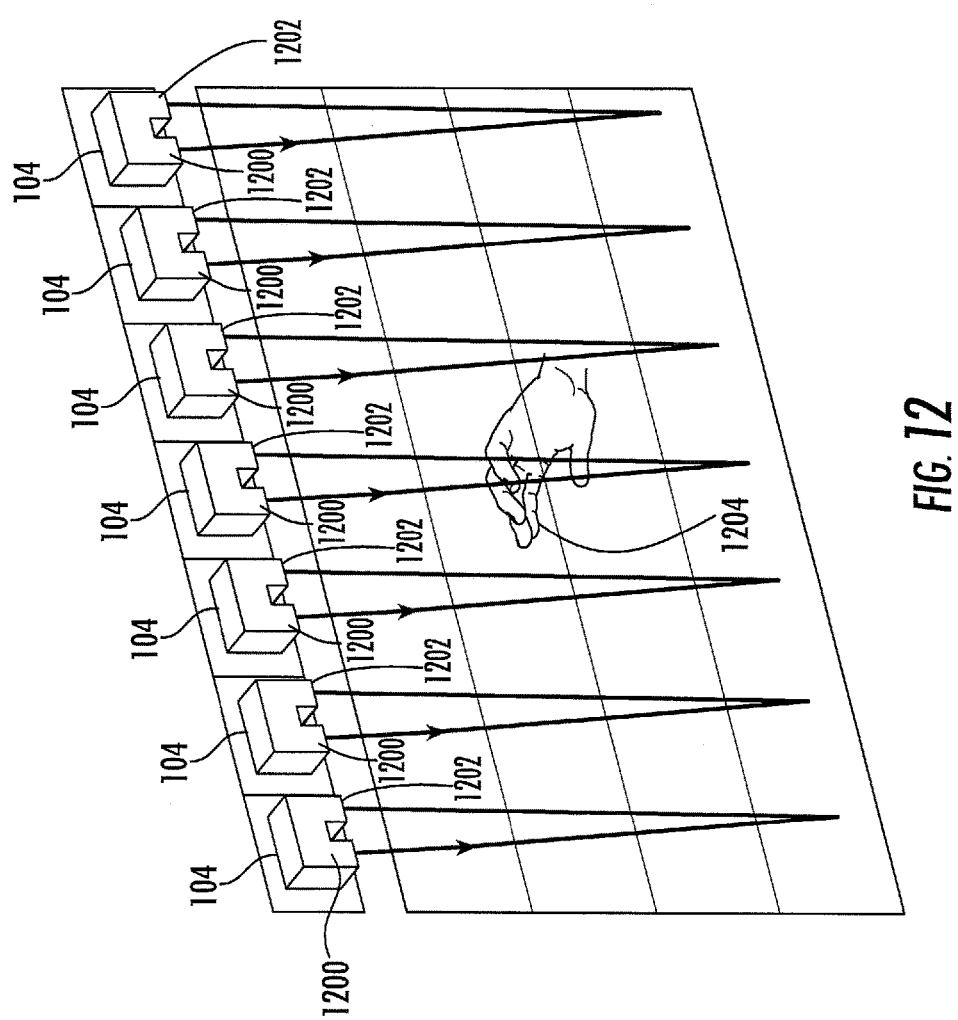
FIG. 12 is a schematic diagram illustrating the use of a linear array of proximity sensors to generate a sensing curtain according to an embodiment of the subject matter described herein.

Thus, rather than having diffuse infrared pickup detection sensors located at the edge of each shelf, a plurality of infrared range finders may be located at the top, bottom or side of each shelf to form a sensor curtain to detect pickup and put back events for products on a shelf. FIG. 12 illustrates this aspect. Referring to FIG. 12, a plurality of infrared range finder sensor segments 104 are located at the top of a retail shelf. Each sensor segment 104 includes an infrared transmitter 1200 and an infrared receiver 1202. The infrared transmitter transmits an infrared beam downward across the face of a plurality of shelves in a direction orthogonal to user access to the shelf. Each receiver 1202 detects the reflected signal when the transmitted beam is interrupted by an object, such as a user's hand.

Figure 13:
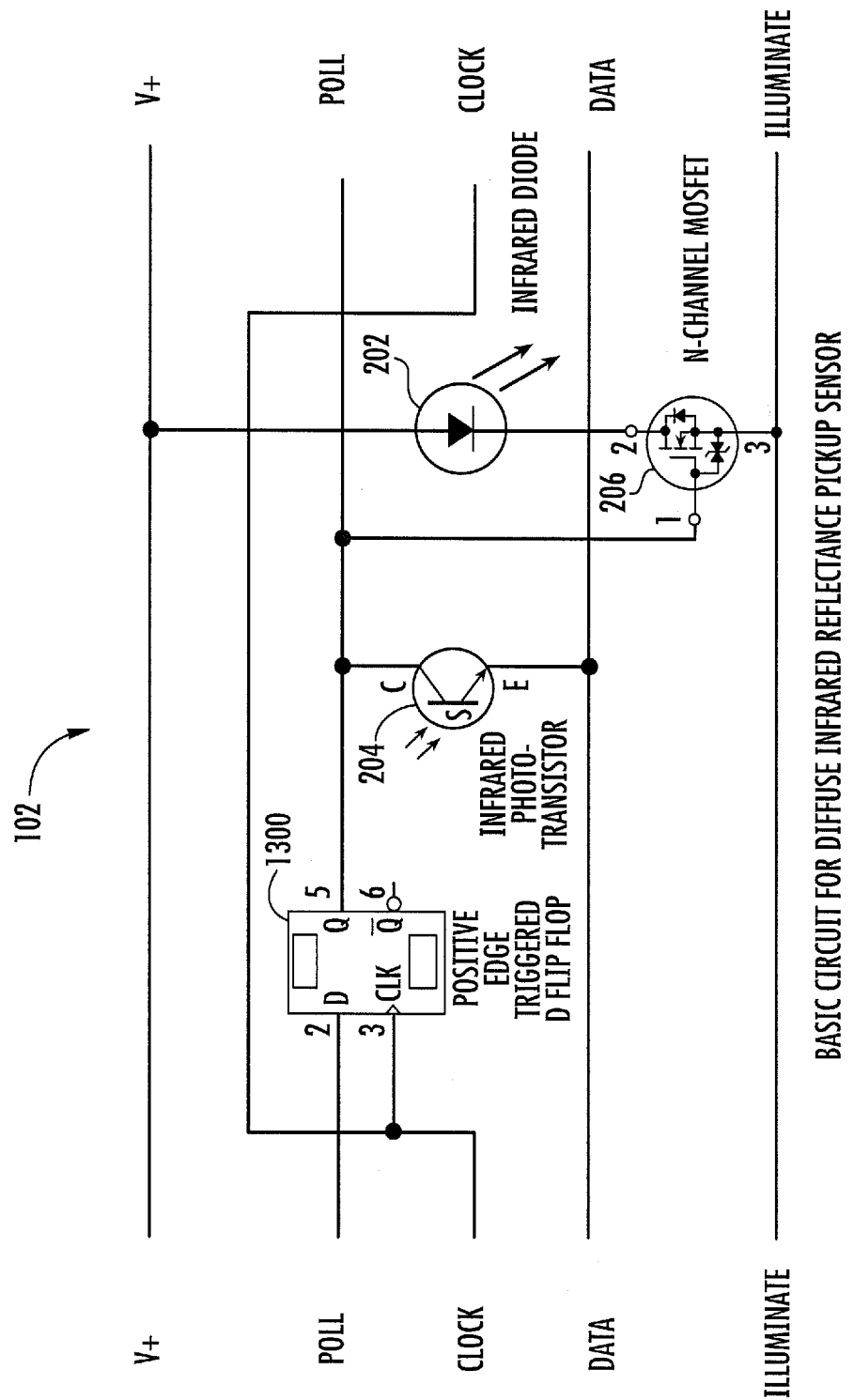
FIG. 13 is a schematic diagram illustrating electrical components of a diffuse infrared reflective pickup sensor of a modular sensor segment according to an embodiment of the subject matter described herein.
Figure 14:
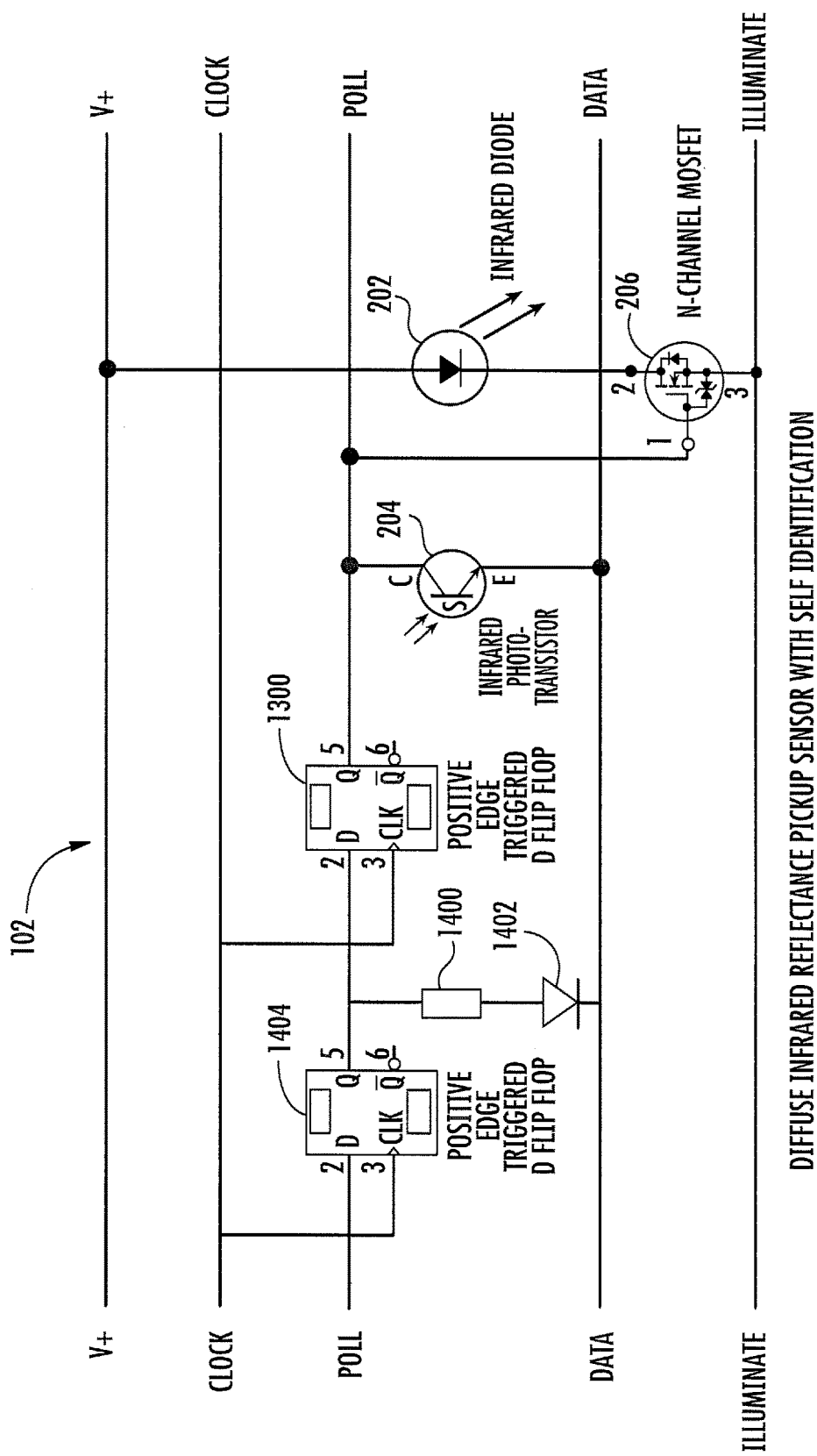
FIG. 14 is a schematic diagram illustrating exemplary electrical components of a diffuse infrared pickup sensor with self-identification according to an embodiment of the subject matter described herein.

FIG. 13 is a circuit diagram illustrating an exemplary circuit for each diffuse infrared sensor segment 102. Referring to FIG. 13, each sensor segment 102 includes transmitter 202, which may be an infrared diode, and receiver 204, which may be an infrared phototransistor. An N-channel transistor 206 turns on and off to control the illumination signal. A D flip-flop 1300 outputs the polling signal to execute two functions: (1) to apply voltage to receiver 204 and thus enable it to transmit to the data conductor and (2) also open the gate of MOSFET 206 to allow it to illuminate when the illuminate line goes low. FIG. 14 is a schematic diagram illustrating additional circuitry of each diffuse infrared sensor segment for providing self-identification. In addition to the components illustrated in FIG. 13, the diagram illustrated in FIG. 14 includes an identifying resistor 1400 across which the voltage drop is used to determine the sensor type as described above. A diode 1402 allows current in one direction from the polling conductor to the data conductor. An additional D flip-flop 1404 controls the polling of sensor segment 102 for the sensor type.

Figure 15:
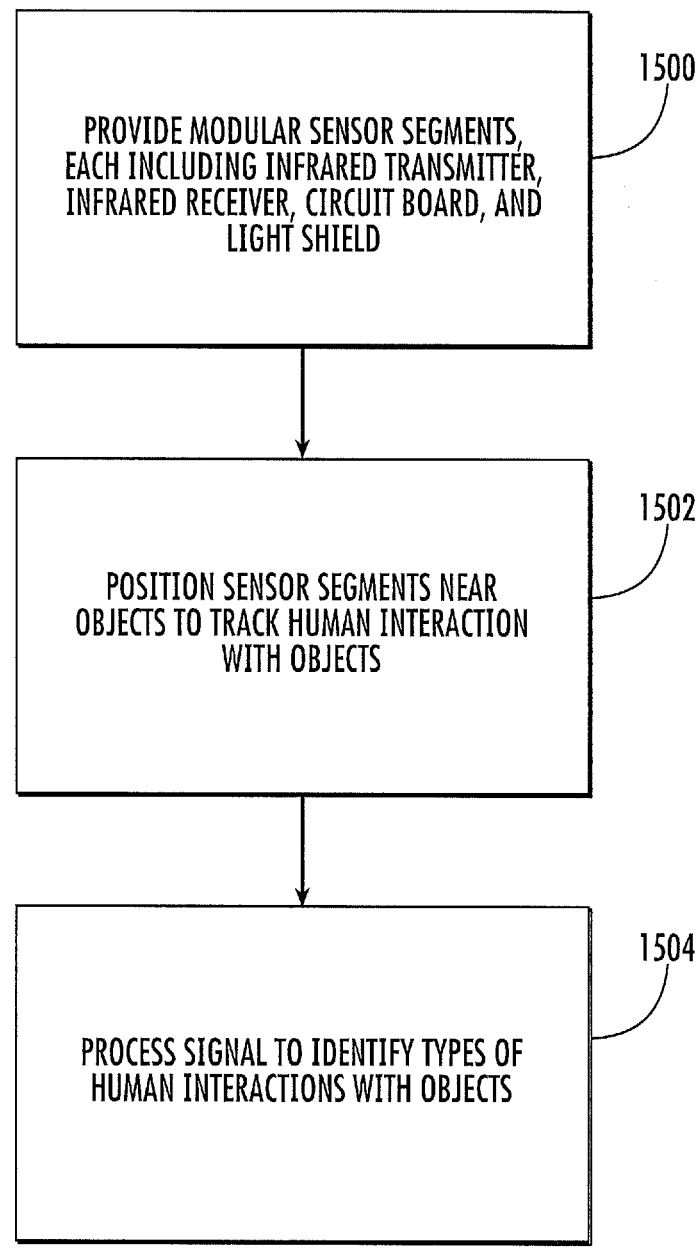
FIG. 15 is a flowchart illustrating exemplary steps for tracking objects using modular sensor segments according to an embodiment of the subject matter described herein.

FIG. 15 is a flow chart illustrating a process for tracking human interaction with objects using modular sensor segments according to an embodiment of the subject matter described herein. Referring to FIG. 15, in step 1500, modular sensor segments, each having a transmitter, a receiver, a circuit board, and a light shield are provided. In step 1502, the sensor segments are positioned near objects to track human interaction with the objects. In step 1504, output signals from the sensors are processed to identify types of human interactions with objects. Types of interactions that may be identified include pickup events, putback events, moving toward or away from the sensor array, and hand gestures, in the case where the sensor array is used as a user interface.

In some embodiments the logging system may conduct diagnostics on a sensor segment to ensure proper functioning. For pickup segments, current through the transmitter may be measured and excessively high or low signal flagged to system operator for maintenance. Likewise for proximity segments, current through the transmitter may be measured. If the signal from the system is being transmitted over WiFi then Wi-Fi signal strength may be measured. More sophisticated segments may be polled for digital error codes.

It is inevitable in a retail environment that on occasion that a sensor segment will become blocked, either by one or more articles in the store, shoppers or both. In these circumstances it is of utility to create an alarm to have these conditions corrected. This may done by counting the number of seconds since a segment was first occluded—at a certain time threshold an alarm is launched to service personnel and data from that segment filtered out of any analytics until the condition is corrected.

It is inevitable in a retail environment that on occasion there will be theft, especially of high value items. In some embodiments a theft alarm may be created if an unusually high number of pickups/putbacks are detected within a set period, or if one or more unusually large object (for example a whole box of product) is removed from the display.

In some embodiments, a sensor array can be used to track the number of product items removed from the shelf and create an alarm when a facing is either out of stock, or approaching out of stock.

In some embodiments it is of utility to add a shield line to the bus—by shielding the cables between sections it is possible to reduce EMI crosstalk between lines in the bus. Some sensors are particularly noisy especially those with pulsed sensors and in these circumstances shielding may be needed to meet local EMI/EMC standards.

In some embodiments of infrared diffuse reflection, or proximity sensing, sensor pitch should generally be selected to match the smallest object that is to be detected. In the case of a human hand around 2 inches is generally sufficient. In the case of a human body the width of a human waist, 12 inches may be more appropriate.

In some embodiments of infrared diffuse reflection when sensors are positioned on a fixed pitch, it is necessary to map physical sensors to a logical planogram. This may be accomplished by putting the logging device into calibration mode, then having the operator touch the perimeters of each product box in sequence so as to assign a range of sensor positions to each product.

In some embodiments a dense array of infrared sensors may be used to create a contactless user interface or object scanner—in these embodiments a finer pitch of sensors may be used down to the size of a human finger, e.g., 1 cm. Position, size, shape and number of objects in the field may be detected. A two-dimensional sensing field may be created by a linear array of sensors, or a three-dimensional field with a two dimensional array of sensors. For example, pickup sensors 102 or proximity sensors 104 may be arranged in a two-dimensional array connected to a computer or other device. When a user passes his hand over the array, the location sensors that detect the user's hand movements can be determined. The movements or gestures can be used to control the computer or other device.

This has the advantage over a conventional camera of range resolution. This has the advantage over glove-based technologies of not needing a glove and so being readily accessible to untrained consumers. This also has the advantage over 3D sensing technologies such as a Moiré camera (e.g. Microsoft Kinect) of being functional down to zero range from sensing array, and ability to resolve extremely fine features such as individual fingers, thus better suited to tight spaces such as retail.

In some applications, a modular sensor segment may be constructed with one or more weight sensors on a T-mount. Weight sensors tend to show high variability hence in such applications it is advantageous to include a local calibration resistor, or on a self-identification type system, identify the calibration properties of that particular weight sensor.

In some embodiments, some sensors, such as the Sharp model GP2Y0A02YK0F, may be used for either proximity or pickup sensing. These sensors produce a continuous output whether illuminated or not. In these cases it is of utility to include an analog switch in the circuit so that the signal from the sensor only transmits to the data line when the sensor is illuminated.

Some sensor types may have very high power draws—in these cases it is of utility to add a large capacitor in parallel to the sensors power leads to provide a power buffer. In extreme cases it may also be of utility to add an inductor into the arrangement to prevent the segment dragging down voltage in the rest of the network.

It will be understood that various details of the subject matter described herein may be changed without departing from the scope of the subject matter described herein. Furthermore, the foregoing description is for the purpose of illustration only, and not for the purpose of limitation.

What is claimed is:

1. A modular system for sequential polling of networks of sensors comprising:
   a sequence of modular sensor segments comprising a first sensor segment and at least a second sensor segment in series;
   each sensor segment comprising:
      a sensing device;
      a circuit board on which the sensing device is mounted;
      a bus, configured to:
         communicate power and signals between the sensor segments; and
         allow segments to be connected to each other in sequential order;
   a signal processor/controller configured to:
      execute a sequential polling cycle wherein each sensor segment is sequentially polled to measure readings from the segments;
      communicate control signals to the segments comprising at least a clock signal and a poll signal;
      identify signals received from the segments; and
      transmit control signals;
   segment circuitry on the segments, configured to cause each segment to respond to sequential polling, and allow the segment to at least receive an input poll signal, receive a clock signal, connect the sensing device to the signal processor/controller, and transmit an output poll signal; and
   a sequential polling cycle wherein:
      only one segment is polled at any one time;
      the first segment to be polled is the first segment in a physical sequence of the segments by the signal processor/controller transmitting a high poll signal to the poll input of the first segment, and the signal processor/controller then transmitting a high clock signal to the segments, causing the poll output of the first segment to go high, and also causing the sensing device to be connected to a data line so that an analog output of the sensing device is read by the signal processor/controller; and
      further control signals cause the polling to transition to the second segment in the physical sequence by the signal processor/controller transmitting a low poll signal to the first segment, and the signal processor/controller then transmitting first a low clock signal and then a high clock signal to the segments, causing the poll output of the first segment to go low and disconnect the first segment from the signal processor/controller, also causing the poll output of the second segment to go high, and also causing the sensing device on the second segment to be connected to the data line so that an analog output of the second segment is read by the signal processor/controller.

2. The system of claim 1 wherein the sensing devices each comprise one or more proximity sensors capable of detecting the presence and position of a human being within the monitored area.

3. The system of claim 1 wherein each modular sensor segment includes first and second lateral edges, a male connector located on the first lateral edge, and a female connector located on the second lateral edge wherein the modular sensor segments are removably connectable to each other via their respective male and female connectors to produce arrays of modular sensor segments of desired configuration.

4. The system of claim 1 comprising a plurality of jumper connectors for interconnecting adjacent modular sensor segments using jumper wires.

5. The system of claim 3 wherein the female connectors are keyed to prevent misconnection with a male connector.

6. The system of claim 1 wherein each sensor segment includes a self-identification circuit for individually identifying a type of each sensor segment wherein polling of the segment takes place over the course of a first and second clock cycle; and wherein during the first clock cycle, the segment circuitry transmits a pre-defined voltage to the data line that indicates a type of sensor present on the sensor segment and during the second clock cycle the segment circuitry transmits the analog output of the sensor segment to the data line.

7. The system of claim 1 wherein the sensor segments are infrared reflection range finders and are arranged in a two dimensional array so as to form a user interface.

8. A method for tracking human interactions with objects using modular sensor segments, the method comprising:
   providing a plurality of modular sensor segments in series, the plurality of modular sensor segments communicatively coupled to a bus and a processor, each having an infrared transmitter, an infrared receiver, and a light shield configured to separate transmit and receive signal paths and to reduce interference from ambient light;
   positioning the sensor segments near objects and activating sensors of the segments to track human interaction with the objects;
   communicating, by the processor, control signals to each segment;
   causing each segment to be polled sequentially by circuitry on the plurality of modular sensor segments, wherein:
      only one segment is polled at any one time;
      a first segment to be polled is the first segment in a physical sequence of the plurality of modular sensor segments;
      when a segment is polled, a corresponding analog output is connected to a data line so that the analog output is read by the processor; and
      receipt of a clock signal pulse causes polling to transition to a next segment in the physical sequence;
   and
   processing, by the processor, analog output signals from the sensors to identify types of human interactions with objects.

9. A system for detecting pickup and putback of objects from a retail fixture comprising:
   a plurality of sensing devices, wherein the sensing devices each comprise one or more pickup sensors capable of detecting pickup and putback of objects from a monitored area, wherein the pickup sensors each comprise a transmitter and receiver, wherein the sensing devices are configured so the receiver receives a reflected portion of the energy emitted from the transmitter, and wherein the pickup sensors are oriented to direct a beam upwards from a shelf; and a signal processor/controller configured to:

receive the reflected signal from each sensing device over time;

log each reflected signal from start to finish of an event; and analyze the logged signal for each event so as to distinguish whether a pickup or a putback took place during that event, wherein a pickup is identified by a peak in the logged signal toward the end of an event, and a putback is identified by a peak in the logged signal toward the beginning of an event.

10. The system of claim 9 where the pickup sensors each comprise a circuit board, an infrared transmitter, an infrared receiver for tracking human physical interactions with objects, and a physical shield mounted on the circuit board configured to separate transmit and receive optical signal paths and to shield the transmitter and receiver from interference from ambient light.

11. The system of claim 10 wherein the shield comprises a housing that covers the transmitter and the receiver in a direction orthogonal to a sensing direction and a separating member interposed between the transmit and receive light paths, wherein the housing forms openings in the sensing direction to allow light transmitted from the transmitter to exit the housing and light reflected from an object to enter the housing.

12. The system of claim 10 wherein the shield is removably connectable to the circuit board.

13. The system of claim 10 wherein the signal processor/controller is configured to detect size or proximity of an object by analyzing the strength of the reflected signals.

14. The system of claim 9 wherein the modular sensor segments are configured to generate a curtain of electromagnetic energy in a direction orthogonal to entry of a retail display unit.

15. The system of claim 10 wherein the transmitter comprises an infrared diode, the receiver comprises an infrared phototransistor and wherein each modular sensor segment further includes a second transistor for controlling an illuminate signal and at least one logic gate for allowing polling of each modular sensor segment.

16. The system of claim 10 wherein the signal processor/controller is configured to modulate an infrared signal transmitted by the transmitter and wherein the receiver is configured to detect the modulated signal reflected from objects in a sensing range.

17. The system of claim 9 wherein the sensing devices comprise a series of range finding devices connected in sequence on a close pitch so that the sensing fields of adjacent range finding devices partially overlap to create a continuous sensing field for pickup tracking that measures both the horizontal position and the height of a shopper's hand at any location in the monitored area.

* * * * *